United States Patent [19]
Hafner et al.

[11] Patent Number: 5,327,087
[45] Date of Patent: Jul. 5, 1994

[54] NMR MAGIC SANDWICH IMAGING METHOD

[75] Inventors: Siegfried Hafner, Blaustein, Fed. Rep. of Germany; Dan E. Demco, Cluy-Napoca, Romania; Rainer Kimmich, Ulm, Fed. Rep. of Germany

[73] Assignee: Bruker Analytische Messtechnik GmbH, Fed. Rep. of Germany

[21] Appl. No.: 858,539

[22] Filed: Mar. 26, 1992

[30] Foreign Application Priority Data

Mar. 28, 1991 [DE] Fed. Rep. of Germany ........ 4110199

[51] Int. Cl.$^5$ .............................................. G01R 33/20
[52] U.S. Cl. ...................................... 324/309; 324/307
[58] Field of Search ........................ 324/300, 307, 309

[56] References Cited

U.S. PATENT DOCUMENTS 5,126,673 6/1992 Hennig ................................ 324/309

FOREIGN PATENT DOCUMENTS 2150302 6/1985 United Kingdom .

OTHER PUBLICATIONS

"Spatially Resolved Proton NMR Dipolar Spectra as a Measure of Local Molecular Mobility in Solids," S. Matsui, J. of Magn. Res. vol. 95, pp. 149-153 (1991).
"Magic echo solid state NMR imaging", Hafner et al., Meas. Sci. Tech. 2 (1991) pp. 882-885.
Journal of Magnetic Resonance, vol. 96, No. 2 pp. 307-322, Feb. 1, 1992.
Chemical Physics Letters, vol. 179, No. 1, 2 pp. 187-190, Apr. 12, 1991.
Physics Letters, vol. 45A, No. 2, pp. 113-114, Sep. 10, 1973.
Israelite paper: A. Pines, Won-Kyu-Rhim, J. S. Waugh: "Homogeneous and inhomogeneous spin echoes in solids" in: Abstracts of the 4th International Symposium on Magnetic Resonance, Israel, Aug. 1971, p. 1.
Israelite paper: J. S. Waugh, Rhim W. K., A. Pines: "Spin echoes and Loschmidt's paradox" in: Abstracts of the 4th International Symposium on Magnetic Resonance, Israel, Aug. 1971, p. 1.
Journal of Magnetic Resonance, 72, 224–229 (1987): P. J. McDonald, J. J. Attard and D. G. Taylor: "A New Approach to the NMR Imaging of Solids".

*Primary Examiner*—Michael J. Tokar
*Assistant Examiner*—Raymond Y. Mah
*Attorney, Agent, or Firm*—Walter A. Hackler

[57] ABSTRACT

An NMR imaging method for the investigation of, in particular, solid-like substances which are exposed to a sequence of RF pulses in a homogeneous magnetic field, said sequence including an excitation pulse sequence and an additional pulse sequence, whereby, in one case, in at least one time interval between the end of the excitation pulse sequence and the beginning of the additional pulse sequence and/or in the time interval between the end of the additional pulse sequence and the appearance of an echo signal, the homogeneous magnetic field is at least temporarily overlapped with at least one gradient field and, in another case, at least one part of the sequence of RF pulses is overlapped with at least one RF gradient field, is characterized in that the additional pulse sequence includes a magic sandwich.

21 Claims, 5 Drawing Sheets

|←— 1 cm —→|

1 mm |←—→|

NMR MAGIC SANDWICH IMAGING METHOD

FIELD OF THE INVENTION

The invention concerns an NMR imaging method for the investigation of, in particular, solid-like substances which are exposed to a sequence of RF pulses in a homogeneous magnetic field said sequence including an excitation pulse sequence and an additional pulse sequence, whereby at least in one time interval between the end of the excitation pulse sequence and the beginning of the additional pulse sequence and/or in the time interval between the end of the additional pulse sequence and the occurrence of an echo signal, the homogeneous magnetic field is at least temporarily overlapped with at least one gradient field.

DESCRIPTION OF THE PRIOR ART

Such a method is known in the art from the publication of P. J. McDonald et al in J. Magn. Resort. 72, 224 (1987). In this work a nuclear magnetic resonance (NMR) method is described with which a solid echo is produced in a manner known in the art. Thereby an excitation pulse sequence is irradiated in order to excite a transverse magnetization (coherence) on a solid-like sample located in a homogeneous magnetic field. In the publication mentioned, the excitation pulse sequence is comprised of a so-called $\pi/2$ pulse, whose time duration is so chosen that the flip angle $\beta$ of the magnetization with respect to the magnetic field direction assumes a value of 90 degrees. A further pulse sequence consists of a second $\pi/2$ pulse whose phase is shifted by 90 degrees with respect to the first $\pi/2$ pulse and which is irradiated after a time interval T following the first $\pi/2$ pulse. In this fashion a spin echo (solid echo) is produced whose maximum amplitude occurs after a further time interval $\pi$. During the entire time duration $2\pi$ between the first $\pi/2$ pulse and the maximum of the spin echo signal, a magnetic field gradient is present which effects a phase encoding of the echo signal. The amplitude of the solid state echo is recorded as the measurement signal.

In the procedure which is known in the art, the phase encoding time is typically limited to approximately 50 $\mu$s. An insufficient phase coding effect thereby results and, therewith, the relatively low spatial resolution of the resulting NMR image. An additional problem is that, with the solid echo produced in this fashion, the signal losses are relatively large so that the observed signal amplitude is much smaller than that which is theoretically conceivable. With these methods of signal production one obtains, additionally, a distorted solid spectrum whose material characterization analysis is problematic. Finally with this method, the tendency towards image artifacts is particularly high; in particular uncoded signal portions principally occur which lead to so-called zero point artifacts.

Furthermore, the invention concerns a NMR imaging method for the investigation of, in particular, solid-like substances which are exposed to a series of RF pulses in a homogeneous magnetic field, said sequence including an excitation pulse sequence and an additional pulse sequence, whereby at least one part of the sequence of RF pulses is overlapped with at least one RF gradient field.

A method of this type exhibits essentially the same disadvantages as the above described method.

The object of the invention is thereby to introduce NMR imaging methods which allow for a longer phase encoding time, deliver larger signal amplitudes, lead to a largley undistorted solid state spectrum and exhibit a reduced tendancy towards artifacts.

BRIEF SUMMARY OF THE INVENTION

This purpose is accomplished in accordance with the invention in that the additional pulse sequence includes a magic sandwich.

A magic sandwich is subsequently to be understood as an RF pulse sequence whose influence on the development of the spin coherence effectively corresponds to a time reversal. By means of this time reversal the influence of the spin interactions, which normally irreversably lead to the decay of the transverse magnetization and thereby to the measurement signal, is caused to be reversed so that a theoretically complete refocussing of the signals is effected. This is also the case, in contrast to the conventional solid echo method, when the original induction signal has already decayed to zero. In this fashion a very long phase encoding time of the order of magnitude of milliseconds is possible which, in the method known in the art, is hindered by the very short decay time of the induction signals. Due to the complete refocussing, an increased signal amplitude and an undistorted solid state spectrum are additionally obtained. Theoretical calculations as well as experiments with the method in accordance with the invention have additionally shown an extremely low tendancy towards artifacts. In particular, the zero point artifacts which have been present in the conventional methods do not occur.

As in the above discussed prior art, a $\pi/2$ pulse can be utilized as an excitation pulse sequence in the NMR imaging method according to the invention. For wide band applications it can also, however, be advantageous to utilize an excitation pulse which effects a magnetization flip angle $\beta$ of less than 90 degrees.

In an embodiment of the invention the excitation pulse sequence includes at least an adiabatic RF pulse whose frequency spectrum begins far removed from the nuclear magnetic resonance frequency and ends exactly at the resonance frequency. This is particularly advantageous with the second mentioned method in accordance with the invention since, thereby, the magnetization is always rotated through an angle of 90 degrees independent of the local RF field amplitude. Thereby, it is possible to irradiate the entire pulse sequence with a gradient coil while the receiver coil homogeneously accepts the signal.

Instead of the evolution of one quantum coherence in the interval between the excitation pulse sequence and the magic sandwich, the excitation pulse sequence, in one embodiment, includes an RF pulse sequence for the excitation of multi-quantuam coherences which, in and of itself, is known in the art, whereby, prior to the magic sandwich, an RF pulse sequence which is, in and of itself, known in the art is irradiated in order to reverse transform the produced multi-quantum coherence into a one quantum coherence. In this fashion the effect of the field gradients is multiplied which finally leads to an increase in the resolution.

In order to carry out a relaxation experiment with which the image contrast directly represents the relaxation time, in one embodiment, an RF pulse sequence for $T_1$ measurements is irradiated prior to the magic sandwich, by way of example, the inversion recovery sequence or the saturation recovery sequence which are, in and of themselves, known in the art. This sequence can be irradiated together with the excitation pulse or can be composed of an appropriately modified excitation pulse.

In a particularly preferred embodiment a LOSY sequence which is, in and of itself, known in the art is irradiated before the excitation pulse sequence. In this manner a slice selective z magnetization is prepared, whereby the z axis defined by the homogeneous magnetic field lies perpendicular to the chosen slice.

In a particularly simple embodiment the echo signal occurring due to the sequence of RF pulses is recorded completely or partially as induction signal. In this manner it is possible to directly detect the actual phase of the signal by means of a quadrature detector.

In an embodiment which is related to the first mentioned method in accordance with the invention, the echo signal stemming from the sequence of RF pulses, is stored in the direction of the homogeneous magnetic field by means of a $\pi/2$ pulse which is irradiated at the time at which the maximum of the echo signal occurs and whose phase, in two sequential applications of the sequence of RF pulses, is so chosen that both components of the transverse magnetization are encompassed, whereby after the storage procedure a gradient field is switched-off and the magnetization in the direction of the homogeneous magnetic field is translated again by means of a read pulse into the transverse direction and one induction signal each is recorded. The signal can thereby be read out without the disruptive presence of field gradients so that the spectral information is fully maintained.

In order to reduce signal artifacts, in one embodiment, which likewise refers to the first mentioned method in accordance with the invention, the gradient field in the time interval before and/or after the magic sandwich is switched on and off, so that an interfering influence of the gradient field during the magic sandwich and/or during the phase is avoided.

In an embodiment which is applicable to both methods in accordance with the invention, the time duration of the magic sandwich is twice as long as the time interval $\tau$ between the end of the excitation pulse sequence and the beginning of the magic sandwich and the time interval $\tau'$ between the end of the magic sandwich and the occurence of the maximum of the echo taken together.

In a symmetric configuration of the embodiment, $\tau$ is equal to $\tau'$.

Instead of this symmetric configuration of the embodiment it is possible to choose an asymmetric configuration of $\tau$ not equal to $\tau'$. The time duration of the magic sandwich can be so chosen that the magic echo signal occurs directly after the temporal end of the magic sandwich, towards which end, in this case, the gradient only has to be switched once.

In a further embodiment the sequence of RF pulses is applied a plurality of times with successively changed phases of the RF pulse (phase cycles), whereby the corresponding measurement signals stemming from the application of a sequence of RF pulses are accumulated so that the possible presence of artifacts is averaged away.

In order to achieve a multiplication in strength of the phase encoding in another embodiment of the invention, the first magic sandwich of the additional pulse sequence is followed by a number of additional magic sandwiches, whereby each beginning of each of the additional magic sandwiches occurs at a time interval about the maximum of the echo signal produced by the preceding magic sandwich, which corresponds to the time interval between the temporal middle of the excitation pulse sequence and the beginning of the first magic sandwich.

A normal magic echo refocusses only the dephasing of signals due to homonuclear interactions. In order to also achieve the same refocussing effect in interactions with nuclei of differing gyromagnetic ratios, that is to say in cases of heteronuclear interaction, the magic sandwich, according to an embodiment of the invention, should be modified so that a tetraedric magic echo is produced.

In order to achieve a slice selection for 2 D imaging, in a further embodiment, the excitation pulse sequence and/or the magic sandwich includes one or a plurality of slice selective soft $\pi/2$ pulses of low excitation band width and at least one slice selection gradient is irradiated during the time duration of each of the soft $\pi/2$ pulses. Through a plurality of slice selections, it is possible to thereby obtain volume selective signals.

In a further embodiment one does without a slice selection and, effects phase encoding in three dimensions by means of an additional irradiation of a z phase encoding gradient field.

In a combination of the first and second mentioned methods according to the invention, a field gradient $G_x$ or $G_y$ and an RF gradient $G_{1y}$ or $G_{1x}$ are each simultaneously irradiated in each of the corresponding differing spatial directions, whereby the z direction is defined by the direction of the homogeneous magnetic field. It is thereby possible to avoid technical difficulties caused by the simultaneous production of two RF gradients $G_{1y}$ or $G_{1x}$.

If one does not want to lose the chemical shift information, then, in a further embodiment, a multi-pulse line narrowing pulse sequence which is, in and of itself, known in the art can be irradiated approximately at the point in time of the maximum of the magic echo signal in order to read out the signal.

Since fluids, in principal, do not deliver any magic echo, the magic echo sequence acts as a selective filter for solid portions so that, with an inhomogeneous sample, only images of solid portions appear, whereas the NMR signals of the fluid portions are suppressed. Thereby application of the method in accordance with the invention to solid/liquid mixtures is particularly advantageous.

In the event that one wants to nevertheless also obtain signals from the fluid portions of an inhomogeneous sample, the magic sandwich, in an embodiment, exhibits a $\pi$ pulse at the position of half its time duration, and the remaining RF pulses of the magic sandwich are so modified that no phase inversion takes place. With this special magic sandwich it is possible to additionally produce NMR echos from fluid portions of the sample.

In applying the method in accordance with the invention to the investigation of quadrupole nuclei, solid state imaging methods are also applicable to, by way of example, deuteron containing materials.

The invention is more closely described and explained hereinbelow by means of the embodiments represented in the drawing. The features which can be derived from the description and from the drawing can be also applied either individually or collectively in arbitrary combination to other embodiments of the invention. Shown are:

DETAILED DESCRIPTION OF THE PREFERRED EMBODIMENTS

Figure 1:
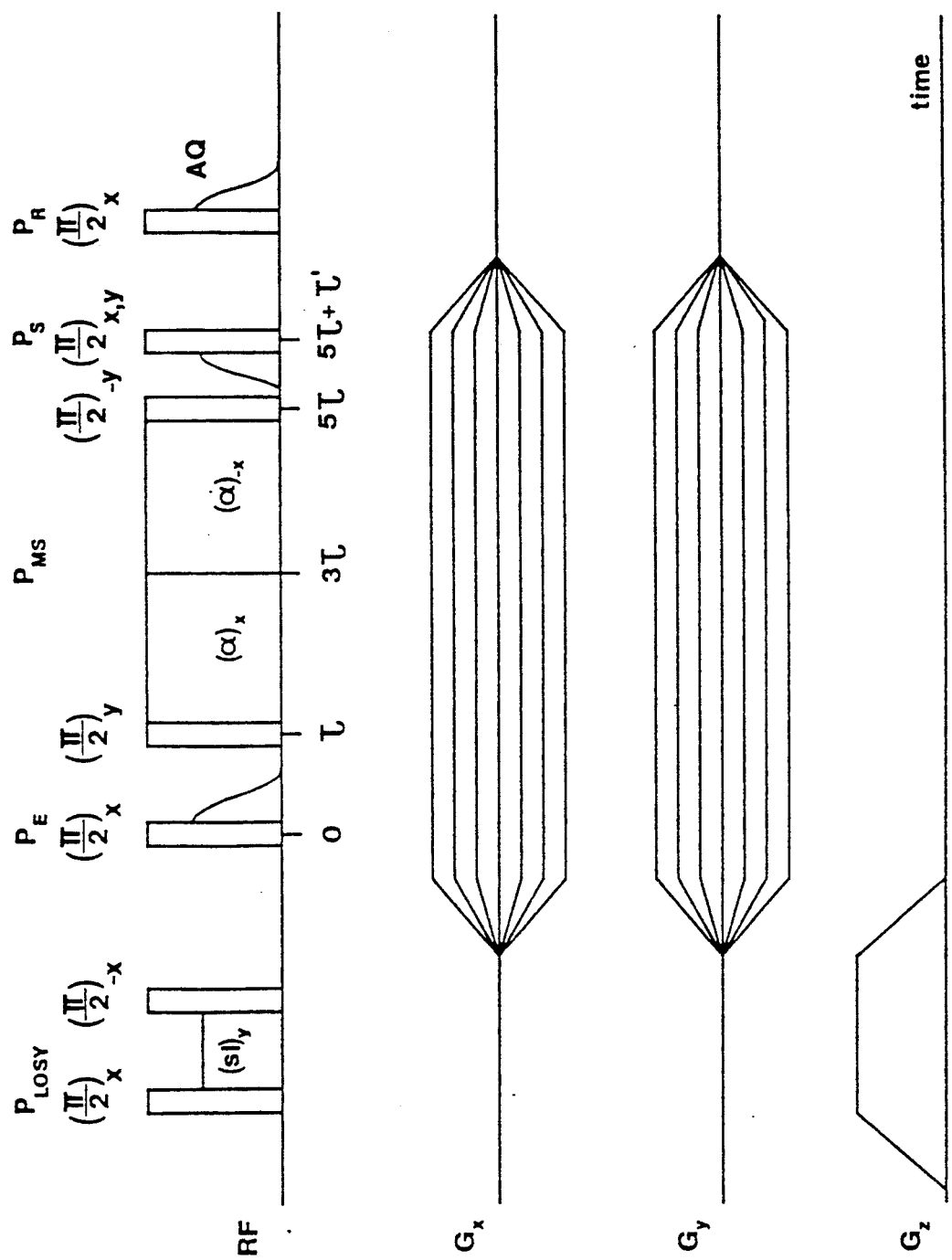
FIG. 1 A RF pulse and a field gradient scheme of an embodiment of the method according to the invention (MEPSI)

NMR imaging methods for solids which stem from the principal of multidimensional Fourier transformation must fulfill two essential requirements. First of all the image contrast information which is as characteristic as possible for the material being investigated must be reproduced. Therefore, not only the spin density is to be considered. Other quantities such as relaxation times, line moments and line shape parameters could be specific for the type of material which is to be imaged. One of the Fourier time domains should therefore be reserved for the encoding of spectral information. For a spectroscopic analysis it is adviseable to take more data points in this time domain than are usually necessary for spatial encoding. Therefore, it is more economical to measure signals without a read field gradient with the spatial information being advantageously encoded in the signal phases.

A second point is that the principal of phase encoding promises, at the same time, a higher encoding efficiency and, as a result, a higher spatial resolution. The reason for this lies in that, by utilizing an appropriate pulse technique, the encoding interval can be chosen to be much longer than the decay time of the FID signals. This is an essential condition in consequence of the strong "widening" effect from dipole or quadrupole interactions in solids.

Both phase encoding techniques in accordance with the invention offer a considerable increase in encoding efficiency. Both methods are based on the construction of the so-called "magic echo". With magic echos it is possible to recover, within certain limits, the full transverse magnetization (in contrast to the incoherent losses associated with the solid echos and Jeener-Broekaert-signals which are known in the art). A further advantage is that much longer echo times can be achieved due to the "time reversal" effects of the "magic sandwich".

The solid imaging method with magic echo phase encoding (magic-echo phase-encoding solid imaging-=MEPSI) includes magic echo pulse sequences in the presence of field gradients. The density operator theory for the magic echo phase encoding process will be introduced below.

The other method in accordance with the invention is based, to a certain degree, on the "rotating frame zeugmatography" known in the art. This method has been proposed for fluid-like systems and is based on gradients with radio frequency (RF) amplitudes instead of main magnetic field gradients. Spatial information is encoded either in signal amplitudes or, with an appropriate modification of the pulse sequence, in the signal phase. The encoding effect is limited by the maximum power and length of the excitation RF pulses. The reduction of the bandwidth of the excitation with increasing pulse lengths can be problematic. For these and other reasons, this technique is normally not applicable to solids.

This problem can however be solved through the application of the magic echo pulse sequence in accordance with the invention. Subsequently, a pulse sequence will be proposed which allows for a phase encoding in the rotating coordinate system via the so-called "rotatory echo", which is produced with the magic sandwich. The density operator theory which will subsequently be presented, shows that a dramatic increase in the encoding effect compared to the conventional rotating frame zeugmatography technique can be expected. This second method in accordance with the invention is subsequently referred to as REPSI (rotatory-echo phase-encoding solid imaging).

The subsequently presented calculations refer to the dipole coupled spins in solids. This normally assumes that one is dealing with a multi spin system. Nevertheless, the same qualitative phenomena can also be expected for two spin systems or even in case of quadrupole interactions in high fields, for isolated spins. The reason is the formally equivalent character of dipole and quadrupole interactions which are described, in both cases, by Hamiltonian operators with a bilinear dependence on the spin operators and a coupling tensor of second order. In other words, one can expect that the dipole coupling spin pulse sequences which are presented will function equally well with quadrupole nuclei.

FIG. 1 shows this two dimensional Fourier transformed version (2-D-FT) of the MEPSI method. Three pulse groups are distinguishable which are related to slice selection, phase encoding and storage of the phase encoded signal.

The first pulse is a LOSY slice selection pulse ($P_{LOSY}$) and produces a slice selective z magnetization. The spins outside of this slice are saturated and do not participate in the coherence which is to be excited and subsequently recorded. The field gradient is arbitrary taken to be the z direction so that the z axis is perpendicular to the selected slice.

In the example of FIG. 1 the LOSY pulse consists of a $(\pi/2)_x$ excitation pulse followed by a spin lock pulse $(sl)_y$ with a phase difference of 90 degrees relative to the $(\pi/2)_x$ pulse, so that the $B_1$ component of the HF field is in the y direction, as well as a $(\pi/2)_x$ pulse which transforms the magnetization back into the z direction of the rotating coordinate system. ($G_x$, $G_y$) are switched on - The excitation pulse Before the beginning of the magic echo phase encoding method, the field gradients in the x and y directions ($G_x$, $G_y$) are switched on the excitation pulse $P_E = (\pi/2)_x$ produces coherences which develop during a time duration $\tau$. The "time reversal" of the development proceeds in the presence of the spin interaction in consequence of the magic sandwich $P_{MS}$ which, in the example of FIG. 1, is composed of a $(\pi/2)_y$ followed by two "burst" pulses $(a)_x$, $(a)_{-x}$ and a $(\pi/2)_{-y}$ pulse. This combination pulse has a total time duration of $4\tau$. After a further interval $\tau'$ which is ideally identical to $\tau$, the "magic echo" appears. During the entire magic echo pulse sequence, in the example shown, the field gradients $G_x$ and $G_y$ are switched in.

The pulse sequence can also be asymmetric, that is to say, the first time interval of free development before the magic sandwich can be longer, at the expense of the second time interval of free development. Variations of the method are discussed below with which a field gradient is switched off during the magic sandwich. Under such conditions it can be advantageous to have only one single phase encoding interval which is correspondingly longer than in the symmetric case.

The gradient switching times are often relatively long. The magic echo signal can then be taken in the presence of the field encoding gradient or, preferentially, transferred into the z magnetization with the help of a storage pulse $P_s = (\pi/2)_{x,y}$. After switching off the field gradient it is possible to read out the stored magnetization. The storage process much transpire "in quadrature" in order to unambigously obtain the phase information. In this manner the spectral information remains fully accessible.

Figure 2:
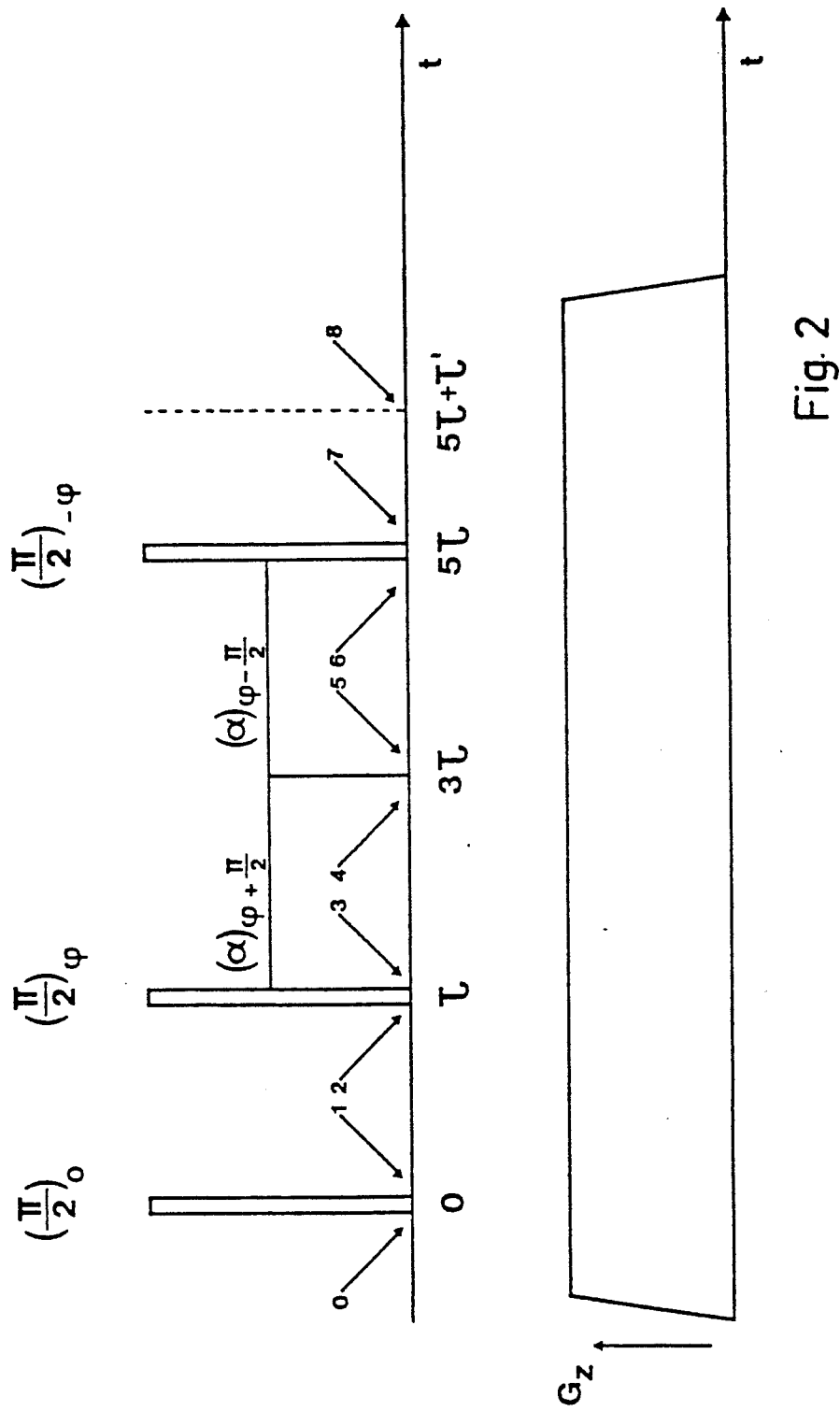
FIG. 2 a scheme of the essential portion of a MEPSI pulse sequence with excitation pulse, magic sandwich and magic echo as well as the thereby switched-in $G_z$ gradients.

In order to demonstrate the phase encoding effect, the response of a dipole coupled solid to a simplified version of the MEPSI pulse sequence is derived below. The essential portion of this pulse sequence is shown in FIG. 2 and is given by:

$$\left(\frac{\pi}{2}\right)_2 - \tau - \left(\frac{\pi}{2}\right)_\phi - (\alpha)_{\phi+\pi/2} - (\alpha)_{\phi-\pi/2} - \left(\frac{\pi}{2}\right)_{-\phi} - \tau' - \text{(magic echo)} \quad [1]$$

The phase "directions" of the RF pulses are in the rotating coordinate system. The coordinates of this reference system are labelled with $x_r$, $y_r$, $z_r$ below in order to distinguish them from the laboratory coordinates which are defined without indices. During the entire pulse sequence, a constant field gradient $G_z$ is assumed. The pulse phase $\phi$ is arbitrary. The $\pi/2$ pulses are assumed to be "ideally hard" that is to say the condition $w_1 \equiv \gamma B_1 > \gamma G_z d_z$ and $w_1 > \gamma B_{loc}$ are assumed to be fulfilled. This situation is designated as the "$\delta$ pulse limit". In this case the entire spectrum and the entire sample are homogeneously excited. $d_z$ is the length of the sample in the z direction, $B_{loc}$ is the local field in the rotating coordinate system, $B_1$ is the amplitude of the RF field and $\gamma$ is the gyromagnetic ratio.

The "magic sandwich" is constructed from the pulses $(\pi/2)_\phi - (\alpha)_{\phi+\pi/2} - (\alpha)_{\phi-\pi/2} - (\pi/2)_{-\phi}$. It consists of two "burst" pulses $(\alpha)_{\phi+\pi/2} - (\alpha)_{\phi-\pi/2}$, which are flanked by two $\pi/2$ pulses. The nominal pulse tilt angle $\alpha$ of the burst pulses is determined through the pulse length $2\tau$ that is to say $\alpha = 2 w_1 \tau$. These pulses should fulfill the condition $w_1 > \gamma B_{loc}$ however not necessarily the condition $w_1 > \gamma G_z d_z$. Thereby the tipping angle is $\pi/2$ only for the position $z = 0$. During the burst pulses the evolution of the spin states under the dipole interaction and the local off-resonance effect produced by the field gradients is taken into consideration.

The following discussion is confined to the magic sandwich described above as a particularly simple member of this class of pulses. One notes that there are many other combinations of sandwich and burst pulses which lead to the effective cancelling of the time dependence of spin states due to the homonuclear dipole interaction. For the special case of the heteronuclear interaction, the "tetraedric magic echo" has been proposed by D. E. Demco in Phys. Letter 45 A, 113 (1973).

In the following all Hamilton operators are expressed in units of angular frequency that is to say $h/2\pi = 1$. The total spin vector of a local multi spin system is designated in the laboratory system as $I = (I_x, I_y, I_z)$, the RF field with $B_{RF}(t) = (2B_1 \cos wt, 0, 0)$ and the external magnetic field with $B_0 = (0,0,B_0)$. A constant gradient is taken arbitrarily in the z direction, that is to say, $G = (0,0, G_z) = (0,0, \delta B_0/\delta z)$. The Hamiltonian operator thereby has the form $$H_L(z,t) = -w_0 I_z - \gamma G_z z I_z 2 w_1 I_x \sin wt + H_{int}(z) \quad [2]$$

whereby $w_0 = \gamma P_0$ and $w_1 = \gamma B_1 = \gamma B_1$. $H_{int}(z)$ represents the local spin interactions.

The time development of the density operator $\rho_L(zt)$ is determined by the Liouville - von Neumann - equation.

$$i \frac{\partial \rho_L(z,t)}{\partial t} = [H_L(z,t), \rho_L(z,t)] \quad [3]$$

Only development effects are considered which are attributable to the secular spin interaction and to the field gradients, while the spin lattice relaxation is neglected.

The development of coherences can most easily be described in the rotating coordinate system (Index $r$ and coordinate $x_r$, $y_r$, $z_r$) as well as in the tilted rotating systems (index tr and coordinates $x_{tr}$, $y_{tr}$, $z_{tr}$).

The density operator in the coordinate system which rotates with an angular frequency w about the z axis is related to the density operator in the laboratory system through the transformation $$\rho_R = R \rho_L R^{-1} \quad [4]$$

whereby $$R = \exp(-iwtI_z) \quad [5]$$

The Liouville - von Neumann - equation then becomes $$i \frac{\partial \rho_R(z,t)}{\partial t} = [H_R(z,t), \rho_R(z,t)] \quad [6]$$

with $$H_R = RH_L R^{-1} + iRR^+ = -\Delta\Omega I_z - w_1 I_x + H^{(0)}_{int}(z) \quad [7]$$

whereby $H^{(0)}_{int}(z)$ represents the secular part of the spin interaction Hamiltonian operator which is dependent on the atomic structure of the corresponding position z and $$\Delta\Omega = w_0 - w + \gamma G_z z \quad [8a]$$

is the local frequency offset of the rotating coordinate system from the resonance. In the following $w = w_0$ obtains so that $$\Delta\Omega = \gamma G_z z \quad [8b]$$

The explicit writing out of the z dependence of the Hamilton operators or the density operators is also omitted below since it is clear that these quantities are influenced by the local sample structure.

For the treatment of the phase shifted RF pulses, it is necessary to define a second rotating coordinate system (R' and coordinates $x'_r$, $y'_r$, $z'_r$). The R and R' systems are correlated through the transformation operator $$R'_\phi = cIp(-i\phi I_{zr}) \qquad [9]$$

whereby $\phi$ is the phase shift between the two reference systems.

The transformation to the tilted rotating coordinate system is given by $$\rho TR = T_\rho R T^{-1} \qquad [10]$$

whereby $$T = exp(i\theta I_{yr}) \qquad [11]$$

with the tilt angle $$\theta = \arctan \frac{w_1}{\Delta\Omega} \qquad [12]$$

The Liouville - yon Neumann - equation, in this reference system, is written as $$i \frac{\partial \rho_{TR}(t)}{\partial t} = [H_{TR}(t), \rho_{TR}(t)] \qquad [13]$$

with $$H_{TR} = w_{eff} I_{ztr} + T H^{(0)}_{int} T^{-1} \qquad [14]$$

and the effective frequency equation $$w_{eff} = \sqrt{w_1^2 + \Delta\Omega^2} \qquad [15]$$

The second term of equation [14] is $$T H^{(0)}_{int} T^{-1} = P_2(\cos\theta) H^{(0)}_{int} + H_{ns} \qquad [16]$$

whereby $P_2(\cos\theta) = \frac{1}{2}(3\cos^2\theta - 1)$ is the Legendre polynomial of second order and $H_{ns}$ is the non-secular interaction Hamiltonian operator which occurs in consequence of the transformation from the untilted rotating coordinate system.

The formal solution to the Liouville - yon Neumann - equations is given by the propagator expression $$\rho R(t) = E_\rho R(0) E^{-1} \qquad [17]$$

with $$E = exp[-i(\Delta\Omega I_{zr}t) - H^{(0)}_{int}t)] \qquad [18]$$

for the development of the free coherences.

In the limit of ideally hard $\pi/2$ pulses, the action of the RF field is described through equation $$\rho R(t) = P_\rho R(0) P^{-1} \qquad [19]$$

with the $(\pi/2)_{xr}$ pulse propagator $$P = exp\left(i\frac{\pi}{2} I_{xr}\right) \qquad [20]$$

The corresponding operator in the phase shifted rotating coordinate system R' is $$P' = exp\left(i\frac{\pi}{2} I_{x'r}\right) \qquad [21]$$

During each burst pulse the development of the density operators is given by $$\rho TR(t+2\tau) = P_{b\tau} TR(t) P^{-1}_b \qquad [22]$$

whereby $$P_b = eIp[i(2w_{eff} I_{ztr} - TH^{(0)}_{int} T^{-1} 2\tau)] \qquad [23]$$

The non secular terms in equation [23] can be neglected for intense RF pulses. One then has $$P_b \approx eIp[i(\alpha I_{ztr} - P_2(\cos\theta) H^{(0)}_{int} 2\tau)] \qquad [24]$$

whereby $\alpha = 2w_{eff}\tau$.

With the above formalism one can effect the series of unitary transformations associated with the pulse sequence of equation [1] or FIG. 2. A convenient abbreviated notation is $$\rho_L(0) \xrightarrow{R} \rho_R(0) \xrightarrow{P} \rho_R(1) \xrightarrow{E} \rho_R(2) \xrightarrow{R'_\phi} \qquad [25]$$

$$\rho_{R'}(2) \xrightarrow{P} \rho_{R'}(3) \xrightarrow{T} \rho_{TR'}(3) \xrightarrow{P_b} \rho_{TR'}(4) \xrightarrow{T^{-1}}$$

$$\rho_{R'}(4) \xrightarrow{R'_\pi} \rho_{R''}(5) \xrightarrow{T^{-1}} \rho_{TR''}(5) \xrightarrow{P_b} \rho_{TR''}(6) \xrightarrow{T}$$

$$\rho_{R''}(6) \xrightarrow{R'_{-\pi}} \rho_{R'}(6) \xrightarrow{P^{-1}} \rho_{R'}(7) \xrightarrow{E} \rho_{R'}(8) = \rho_f$$

The numbers in the above arguments refer to the times indicated by the arrows in FIG. 2.

Below the reduced density operator G is used instead of $\rho$ whereby all irrelevant constant terms or factors have been omitted. In the high field-high temperature approximation, the initial reduced density operator $$\sigma(0) \approx I_z \qquad [26]$$

If one takes into consideration the secular terms of the dipole interaction as the sole contribution to $H^{(0)}_{int}$, one has for the final reduced density operator, $$\sigma_f = I_{x'}(5\tau + \tau')\sin(2\Delta\Omega\tau - \phi) + I_{y'}(5\tau + \tau')\cos(2\Delta\Omega\tau - \phi) \qquad [27]$$

whereby $$I_{x'}(5\tau + \tau') = \qquad [28]$$
$$exp\{-i[\tau' + 2P_2(\sin2\theta)\tau]H^{(0)}_{int}\} I_{x'} exp\{i[\tau' + 2P_2(\sin2\theta)\tau]H^{(0)}_{int}\}$$

$$I_{y'}(5\tau + \tau') = \qquad [29]$$
$$exp\{-i[\tau' + 2P_2(\sin2\theta)\tau]H^{(0)}_{int}\} I_{y'} exp\{i[\tau' + 2P_2(\sin2\theta)\tau]H^{(0)}_{int}\}$$

Clearly, the magic echo achieves its maximum after a time interval $$\tau' = -2P_2(\sin 2\theta)\tau \quad [30]$$

following the magic sandwich. In this way the relevant region of tilt angles $\theta$ is defined through the condition $\tau \geq 0$.

At the position $z=0$ where, by no means, does the field gradient produce an offset field, the tilt angle $\theta = \pi/2$. The magic echo is therefore formed after a time interval $\tau' = \tau$. This is also true for every position, if the field gradient is 0. The echo forming time $\tau'$ deviates however from $\tau$ at positions where the burst pulses are out of resonance. One notices that the $\delta$ pulse limit is assumed for all $\pi/2$ pulses, but not for the burst pulses.

Tilt angles larger or smaller than $\pi/2$ within the relevant regions of $0 \leq \theta \leq \pi$ produce shorter echo forming intervals $\tau'$. For $\theta = \pi/4$ or $\theta = 3\pi/4$ one expects a maximum at $\tau' = 0$, that is to say, directly after the magic sandwich.

The magic echo signals which are finally detected in the R' reference system are proportional to the expectation value of the $x'_r$ and $Y'_r$ spin components. From the above formalism follows $$\overline{\langle I_{x'_r}(5\tau + \tau')\rangle} \propto Tr\{I_{x'_r}\sigma_f\} \quad [31]$$
$$= Tr\{I_{x'_r}I_{x'_r}(5\tau + \tau')\}\sin(k_z z - \phi)$$

$$\overline{\langle I_{y'_r}(5\tau + \tau')\rangle} \propto Tr\{I_{y'_r}\sigma_f\} \quad [32]$$
$$= Tr\{I_{y'_r}I_{y'_r}(5\tau + \tau')\}\cos(k_z z - \phi)$$

with $$k_z = \gamma G_z(\tau + \tau') \quad [33]$$

The phase encoding effect is obvious.

The signal, detected in quadrature, depends uniquely on the k spatial component $K_z$. The total phase encoding time is $\tau + \tau'$.

The theory can immediately be generalized to phase encoding in differing spatial directions. In this case the k vector is considered instead of its components $$K = \gamma(\tau + \tau')G \quad [34]$$

and the complex phase factor of the signal is exp ($-i k \cdot r$)

The total complex transverse magnetization which is to be detected at the end is $$M_{x'_r} + iM_{y'_r} \propto \langle I_{x'_r}(5\tau + \tau')\rangle + i\langle I_{y'_r}(5\tau + \tau')\rangle \propto e^{i\phi}\int D(r)\exp(-ik \cdot r)dr \quad [35]$$

whereby D(r) refers to the spatially dependent spin density of the sample. Naturally, this function can be weighted with factors which depend on the local relaxation or diffusion.

The above theoretical treatment predicts absolutely no artifacts. However, deviations from the ideal phase encoding occur when the burst pulse is not hard enough to produce a tilt angle $\theta$ which is position independent. One then expects a wide distribution of tilt angles about $\pi/2$ and consequently of $\tau'$ values about $\tau$. The consequence is a smearing of the image information.

In the event that of the $\pi/2$ pulses are not ideally hard, the excitation the spins will, depending on the position, be incomplete. Analogous to the JEPHI technique, zero point artifacts and "Scaled image artifacts" result. These artifacts can be averaged out through "phase cycling" procedures.

A prominent advantage of the use of gradients of the RF amplitude as a means for encoding spatial information is that no main magnetic field gradients must be produced. The only modification of conventional pulsed NMR spectrometers which is necessary is an RF transmitting coil configuration which produces the desired gradients.

Although these methods have only been proposed up to now for fluid-like samples, it is possible, as is intended to be shown here, to, in principle, also utilize this technique for solids. The problem lies therein that long RF pulses must be irradiated onto the sample in order to produce the large flip angle range necessary for good encoding efficiency. This limits, on the other hand, the band-width which can be excited with one pulse. This technique is therefore not suited for the wide lines which are expected from solids.

This problem can, however, be solved by advantageous utilization of the special properties of the magic echo pulse sequence. As in the high field gradient technique described above, the theoretical encoding efficiency is extremely high.

Figure 3:
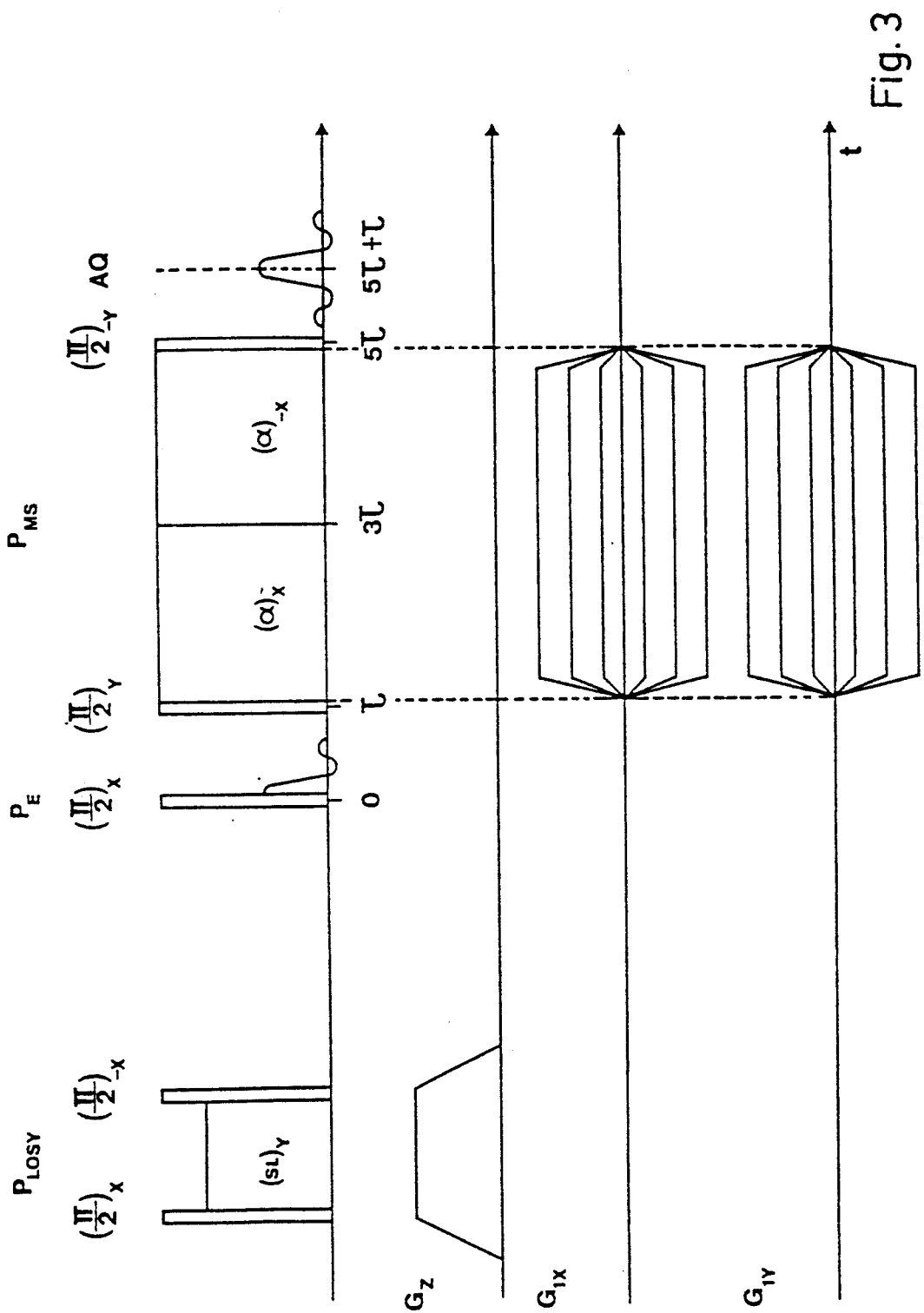
FIG. 3 a scheme for a pulse sequence according to an embodiment of the invention (REPSI) with a previously cycled LOSY sequence.

FIG. 3 shows the proposed pulse sequence. As in the MEPSI technique (FIG. 1) it is comprised of a slice selective portion $P_{Losy}$, an excitation part $P_E$ and the symmetric (or asymmetric) magic echo pulse sequence $P_{MS} = (\pi/2)_\phi(\alpha)_{\phi-\pi/2} (\alpha)_{\phi+\pi/2} (\pi/2)_{-\phi}$. Simultaneous to the burst pulses, RF gradient pulses are applied which produce additional RF fields which depend linearly on the position along the x or y direction. In contrast to proper burst pulses, the RF gradient pulses are active, in the entire magic sandwich interval, without effecting phase shifting. It is assumed that $\pi/2$ pulses act homogeneously so that the flip angle produced by them is position The problem of production of RF pulses which act homogeneously as well as inhomogeneously during the course of a pulse sequence can be solved through the utilization of a combination of electrically orthogonal RF coils. This can be a configuration with crossed coils or a coaxial combination of an anti-Helmholtz coil pair with a solenoid. The "homogeneous" coil serves simultaneously as the receiver coil.

In the event that the secular interaction becomes too large, the problem can also be solved through the adiabatic excitation of the sample with the assistance of a single transmitting coil. The 90° RF. pulses are then adiabatic pulses, that is to say, they begin at frequencies far removed from the resonance and end exactly at the resonance. In this manner, the magnetization is flipped by 90° independent of the local RF field amplitude. Thereby, it is possible for the entire pulse sequence to be irradiated with one gradient coil, whereas the receiver coil collects the signal homogeneously. The limitation of this version lies in that the process must be "fast adiabatic". This condition can be difficult to fulfill with very strong secular interactions.

Figure 4:
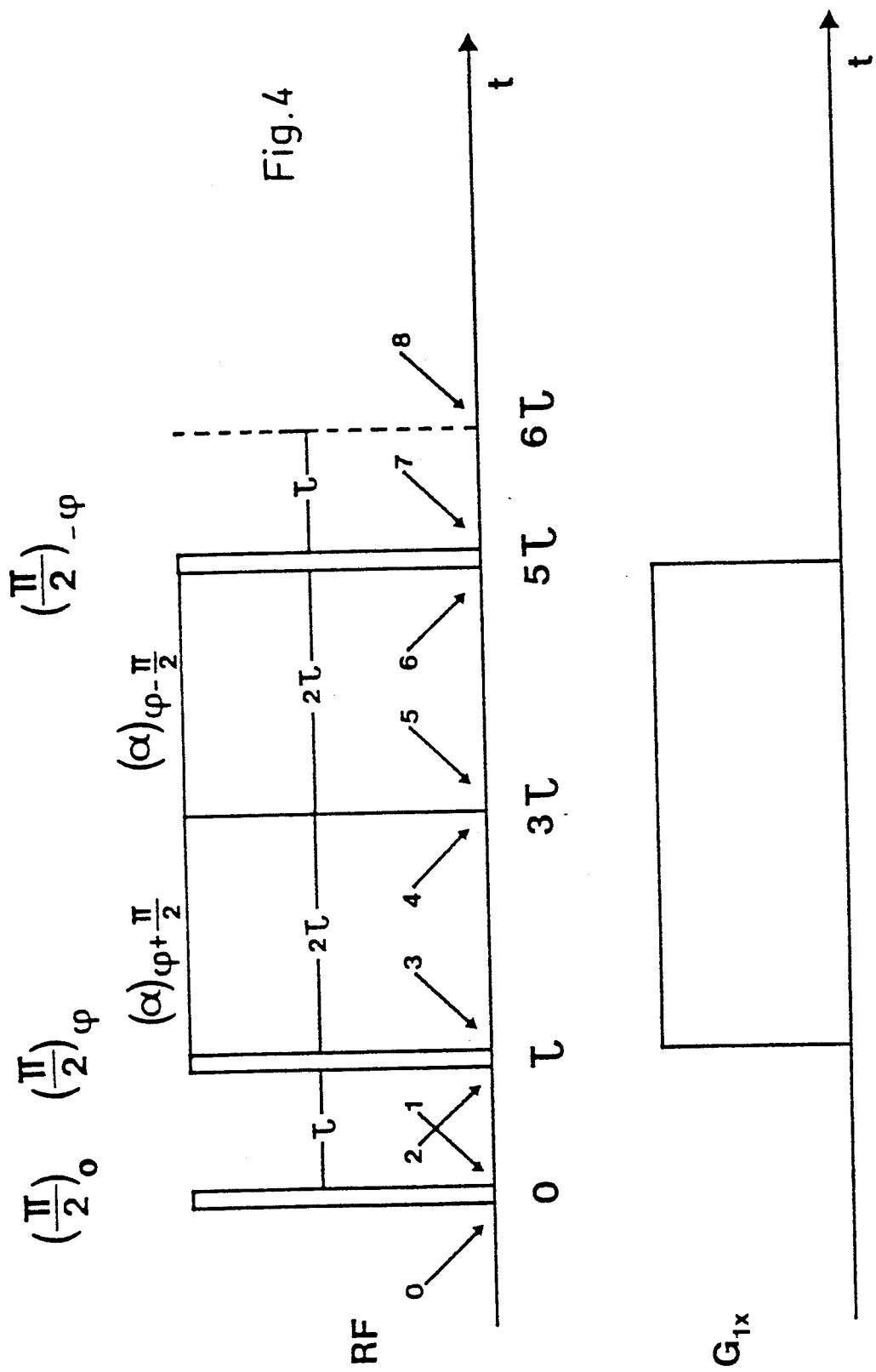
FIG. 4 the essential portion of a REPSI pulse sequence with excitation pulse, magic sandwich and magic echo as well as switched in $G_{1x}$ RF field gradient.

Theoretical treatment is confined to the portion of the pulse sequence which is essential to the demonstration of the phase encoding process. The corresponding scheme is shown in FIG. 4. The RF field amplitudes of the 90° RF pulses should act homogeneously on the sample, while the amplitudes of the superimposed gradient and burst pulses observe the equation $$B_1(I) = B_{10} + G_{1x}I \quad [36]$$

whereby $G_{1x} = \delta P_1/\delta x$.

The 90° RF pulse pulse propagators were already given in equations [20] and [21] through [24]. The superimposed burst pulse propagators (see equations [23] and [24]) now take the modified form $$P_1 \approx \exp[i(\alpha + \Delta w_1 2\tau)I_{ztr} - iP_2(\bos\theta)H^{(0)}_{ini}2\tau] \quad [37]$$

whereby $\alpha = 2w_{10}\tau$, $w_{10}\gamma B_{10}$ and $w_1 = \gamma G_{1x}X$. One notices that the above approximation, which only takes into consideration the secular dipole Hamiltonian operator of the spin interaction in the tilted rotating coordinate system, is justified for RF amplitudes which satisfy the condition $$B_{10} > B_{loc}^{TR} + G_{1x}d_x \quad [38]$$

where $B^{TR}_{loc}$ is the local field in the tilted rotating coordinate system and $d_x$ is the extension of the probe in the x direction. The second burst pulse is phase inverted, while the gradient pulse maintains its phase. The total propagator is therefore $$P_b \approx \exp[i(-\alpha + \Delta w_1 2\tau)I_{ztr} - iP_2(\cos\theta)H^{(0)}_{ini}2\tau] \quad [39]$$

Analogous to the treatment of the MEPSI pulse sequence, one finds for the reduced final density operator $$\sigma_f = I_{x'}\sin(k_x x - \phi) + I_{y'}\cos(k_x x - \phi) \quad [40]$$

whereby $$k_I = 4\tau\gamma G_{1I} \quad [41]$$

The quadrature components of the magic echo signal at the time $t = 6\tau$ are proportional to $$\overline{\langle I_{x'}(6\tau)\rangle} \propto Tr\{I_{x'}\sigma_f\} \quad [42]$$
$$= Tr\{I_{x'}I_{x'}(6\tau)\}\sin(k_x x - \phi)$$

$$\overline{\langle I_{y'}(6\tau)\rangle} \propto Tr\{I_{y'}\sigma_f\} \quad [43]$$
$$= Tr\{I_{y'}I_{y'}(6\tau)\}\cos(k_x x - \phi)$$

The phase encoding effect is thereby obvious. The total complex transverse magnetization which is to be shown at the end is $$M_I + iM_y\overline{\langle I_I(6\tau)\rangle} + i\overline{\langle I_{y'}(6\tau)\rangle} \, e^{i\phi} \int D(r)e I p(-ik\cdot r)dr \quad [44]$$

the local spin density function D(r) can contain weighting factors which take into consideration the total relaxation or diffusion.

The RF pulses are irradiated in the absence of any kind of magnetic field gradients and, for this reason, no artifacts can occur. This means, in particular, that no zero-point artifacts or "scaled image" artifacts are expected. Artifacts can, however, occur due to the influence of the non-secular terms in the event of moderate burst pulse RF amplitudes. In this case, the refocussing process depends on the RF amplitude, that is to say, on the position. A potential consequence is a varying image intensity along the direction of the $B_1$ gradient.

Figure 5A:
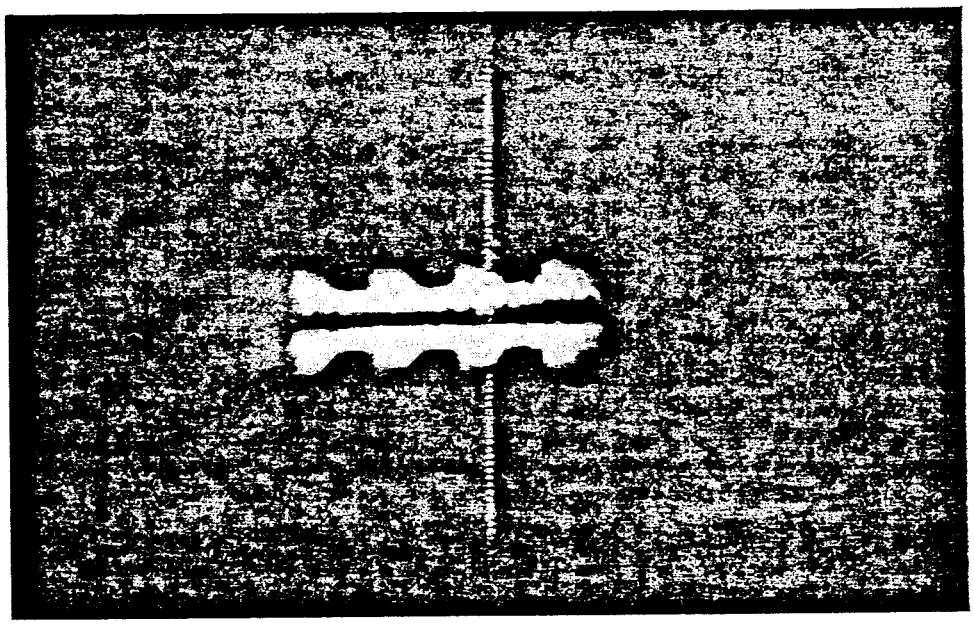
FIG. 5a a test image of a plastic plug.
Figure 5B:
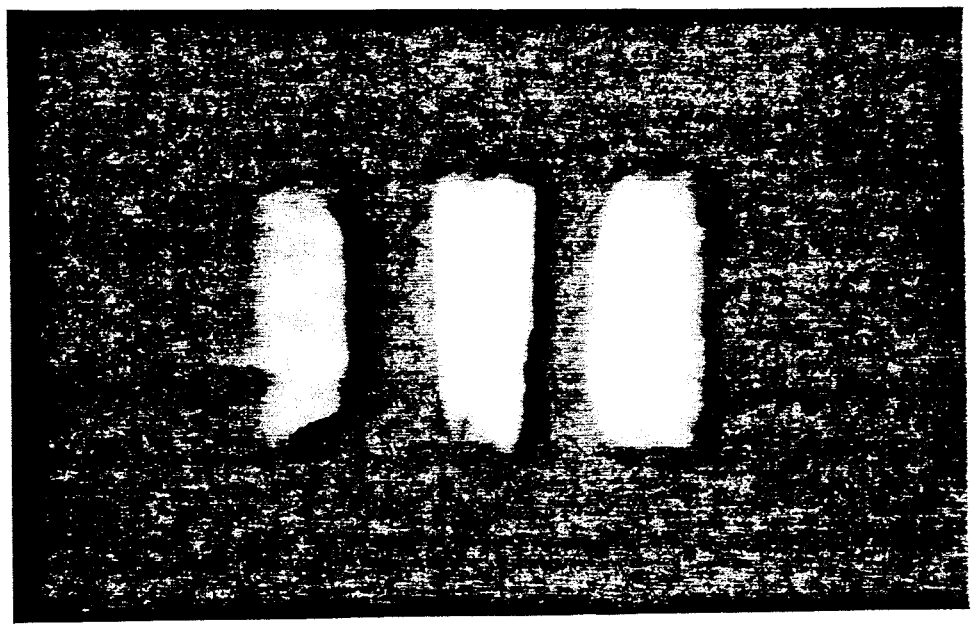
FIG. 5b a test image of a hexamethylbenzenetetrafluorethylene sample sandwich.

The pulse sequence of FIG. 1 was tested by means of imaging of a plastic plug and a sandwich sample consisting of hexamethylbenzene layers and tetrafluorethylene intermediate layers. A conventional BRUKER Biospec 47/40 tomograph operating at a frequency of 200 MHz was utilized together with a self-made probehead with an RF coil of 6 mm diameter. The 90° pulse length was 4 μs, which corresponds to an RF field amplitude of $B_1 = 14.7G$. The distance between RF pulses was $\tau = 150$ or 200 μs. Due to apparative conditions, it was necessary to separate the individual RF pulses of the composite magic sandwich pulses by intermediate time intervals of 2 μs. The maximum field gradient was 15 G/cm. No slice selection pulse was applied so that the images represent two dimensional projections of the object onto a plane. The results are shown in FIG. 5, namely the test image of the plastic plug in FIG. 5a and the test image of hexamethylbenzene/tetrafluorethylene sandwich sample in FIG. 5b. The pictures were obtained with the assistance of the MEPSI technique. The length of the plug is 12.7 mm, the diameter 5 mm. The sandwich sample was 6 mm long and had a diameter of 4.2 mm. The thickness of the intermediate layers was 1 mm and 1.3 mm respectively. The pixel resolution was 128 × 128 and 64 × 64 respectively.

With the exception of an artifact line which is attributable to a finite number of measuring points in k space, the test objects are clearly reproduced. The dreaded "scaled image" artifact was not observed. The phase encoding effect has been, thereby, experimentally verified.

The general advantage of the magic echo phase encoding technique presented is a dramatic increase in the achievable encoding time, so that rigid solids can be imaged with high spatial resolution through the utilization of operational gradients.

The proposed imaging methods are analogous to the Fourier transform techniques which are usually used for fluid-like samples, namely, the standard spin echo Fourier transform technique and the "rotating frame zeugmathography" procedure. As the corresponding magic echo versions, the MEPSI method and the REPSY method were presented with which, in accordance with the invention, the respective main field or RF field amplitude gradients are utilized.

The phase encoding time with MEPSI is significantly longer than than of other phase encoding solid imaging methods, in particular, the solid echo phase encoding or the JEPHI method. The phase encoding time can, with completely rigid solids, even lie in the millisecond region provided that the RF amplitude of the burst pulses is large enough. This time must be compared to the transverse relaxation time which assumes the order of magnitude of 10 μs in solids. The consequence is that the achievable resolution is significantly increased. With the modest field strength and the small field gradients which are available in the above described experiment, one estimates a resolution of approximately 200 μm. A still better resolution can be expected under the more favorable conditions which obtain in tomographs equipped for NMR microscopy. Realistic resolutions thereby lie in the range of 50 to 100 μm.

A similar resolution may also be achieved with MAS, static field gradients or multi pulse line narrowing techniques. One must, however, observe that the MEPSI method can be carried out with a normal NMR imaging system without special hardware modifications which are normally a prerequisite to the application of other techniques. One notes, in addition, that the complete solid spectroscopic information is maintained in the event that the pulse sequence is complemented through a memory/read out pulse sequence, which, in turn, allows one to switch-off the gradients before signal recording. In the event that high resolution spectroscopic information is desired, the method can be further combined with multi-pulse line narrowing sequences.

The MEPSI pulse sequence has been shown to be quite resistant to artifacts. This is an additional prominent advantage of this technique with respect to other phase encoding methods. If the field gradients are switched-off during the magic sandwich, all artifacts due to incomplete pulses are thereby, in fact, eliminated. In this case, it can be advantageous to form the pulse sequence asymmetrically, so that only a single phase encoding interval remains.

The REPSI technique requires a special probehead with electrically orthogonal coils for homogeneous RF fields or RF gradients. The "non-adiabatic" version requires, additionally, two transmitters. These hardware necessities present a certain disadvantage compared to the MEPSI technique. On the other hand, no main field gradient system is, in principal, required.

A further advantage of the REPSI method is that the signal can be intrinsically obtained in the absence of field gradients except for those inhomogeneities inherent in the magnetic system. Thereby, no storage pulses are necessary. This pulse sequence is, intrinsically, not very susceptible to artifacts since the 90° RF pulses are irradiated in the absence of the field gradient so that the nominal flip angle, even with the "non-adiabatic" version, is homogeneously produced. One also notes that the phase encoding time with REPSI is twice as long as with MEPSI.

Due to the bilinear character and the analogous angular dependence of the (largely active portions) of the spin interaction Hamilton operator, the same pulse schemes and, consequently, the same imaging method discussed above functions not only with dipole nuclei such as, for example, protons but also with quadrupole nuclei. Therefore, solid state imaging with deuterons is a further option for MEPSI and REPSI techniques. The requirement is that the RF field amplitude of the burst pulses exceeds the local fields from the quadrupole interaction. In the event that this is difficult to accomplish it can be advantageous, prior to irradiation of the magic sandwich pulses, to transfer one quantum coherences into double or multi quantum coherences and then back again into one quantum coherences. In this event, the double quantum transition refers to the quadrupole splitting, while the production of magic echos compensates the dipole interactions.

The above presented and theoretically treated pulse sequences are the simplest versions of magic echo phase encoding NMR imaging sequences. Other variations of magic echo methods can also be combined with encoded gradients.

Magic echo imaging methods produced, ideally, images of solid materials only. In a heterogeneous sample with liquid-like fluid constituents, a filter effect can thereby be expected. It can, however, be desirable to also record signals from the softer portions of the material. In this case, a 180° pulse can be introduced at the middle of the magic sandwich which is then modified in such a manner that no phase inversion takes place which, by way of example, is achieved with two burst pulses of equal phase. The result is that Hahn echos of fluid-like constituents are additionally produced.

Finally, the possibility is also addressed of producing multi-magic echo sequences such that the total phase encoding effect is correspondingly multiplied. In this case, each magic echo serves as the initial coherence for the subsequent pulse sequence which is simply composed of the magic sandwich.

In embodiments of the invention, the method can be carried out in such a fashion that a phase gradient is utilized only in one dimension and for the other dimension, the read-out of the magic echo signal is effected with a multi-pulse line narrowing pulse sequence under the influence of a read gradient.

It is also possible to switch the magnetic field gradients during the magic sandwich.

Finally, in embodiments of the invention, the magic sandwich can be comprised from a continuous sequence of radio frequency pulses.

What is claimed is:

1. NMR imaging method for the investigation of short transverse relaxation time substances, said method comprising the steps of:
   exposing the short transverse relaxation time substances to a homogeneous magnetic field;
   exposing the short transverse relaxation time substances to a sequence of RF pulses including an excitation pulse sequence and a magic sandwich pulse sequence; and
   at least in one time interval between the end of the excitation pulse sequence and the appearance of an echo signal, overlapping the homogeneous magnetic field, at least temporarily, with at least one gradient field.

2. NMR imaging method according to claim 1, wherein the excitation pulse sequence includes at least one RF pulse causing a flip angle $\beta$ of the magnetization with respect to the direction of the homogeneous magnetic field, said flip angle $\beta$ being between 0° and 180°.

3. NMR imaging method according to claim 1, wherein the excitation pulse sequence includes at least one adiabatic RF pulse.

4. NMR imaging method according to claim 1, wherein the excitation pulse sequence includes an RF pulse sequence for exciting of multi-quantum coherences and that prior to exposing the substance to the magic sandwich pulse sequence, an RF pulse sequence is irradiated for the transformation of the excited multi-quantum coherences into one quantum coherences.

5. NMR imaging method according to claim 1, wherein prior to exposing the substance the magic sandwich, irradiating the substance with an RF pulse sequence for $T_1$ measurement.

6. NMR imaging method according to claim 1, wherein the substance is initiated with a LOSY pulse sequence before the excitation pulse sequence.

7. NMR imaging method according to claim 1, wherein the echo signal, which occurs in consequence of the sequence of RF pulses, is recorded at least partially as an induction signal.

8. NMR imaging method according to claim 1, further comprising irradiating the short transverse relaxation time substance with a sequence of RF pulses with a $\pi/2$ pulse at a point of time of the appearance of a maximum of the echo signal and having a phase, in two sequential applications of the sequence of RF pulses, chosen so that both components of a transverse magnetization are incorporated in order to produce a consequential echo signal, storing the consequential echo signal in the direction of the homogeneous magnetic field, and following the storage step, the gradient field is switched-off, the magnetization in the direction of the homogeneous field is, by means of a read pulse, transferred into a transverse direction and one induction signal each is recorded.

9. NMR imaging procedure according to claim 1, wherein the gradient field is applied only in a time excluding the magic sandwich pulse sequence.

10. NMR imaging method according to claim 1, wherein the time duration of the magic sandwich pulse sequence is four times as long as the time interval between the end of the excitation pulse sequence and the beginning of the magic sandwich pulse sequence.

11. NMR imaging method according to claim 1, wherein the time duration of the magic sandwich pulse sequence is twice as long as the time interval $\tau$ between the end of the excitation pulse sequence and the beginning of the magic sandwich pulse sequence and the time interval $\tau'$ between the end of the magic sandwich pulse sequence and the appearance of the echo signal taken together, whereby the times $\tau$ and $\tau'$ are different in size.

12. NMR imaging method according to claim 1, wherein the short transverse relaxation time substances are exposed to the sequence of RF pulses a plurality of times with successively changed phase of the RF pulse, and accumulating each measurement signal occurring through the application of the sequences of RF pulses.

13. NMR imaging method according to claim 1, wherein a first magic sandwich sequence of the additional pulse sequence is followed by a number of additional magic sequences whereby each beginning of each additional magic sandwich sequence transpires in a time interval about a maximum of the echo signal produced by a previous magic sandwich sequence which, in turn, corresponds to a time interval between an end of the excitation pulse sequence and a beginning of the first magic sandwich sequence.

14. NMR imaging method according to claim 1, wherein the magic sandwich is modified in order to produce a tetraedric magic echo signal.

15. NMR imaging method according to claim 1, wherein the excitation pulse sequence and the magic sandwich includes one or multiple slice selective (soft) $\pi/2$ pulses and that at least one slide selective gradient each is irradiated during the time duration of the soft $\pi/2$ pulse.

16. NMR imaging method according to claim 1, wherein a field gradient $G_x$ or $G_y$ and an RF gradient $G_{1y}$ or $G_{1x}$ are simultaneously irradiated in respective differing spatial directions and the z direction is defined by the direction of the homogeneous magnetic field.

17. NMR imaging method according to claim 1, wherein in order to read-out a magic echo signal, a multi pulse line narrowing pulse sequence is irradiated approximately at the point of time of a magic echo signal maximum.

18. NMR imaging method according to claim 1, wherein a three dimensional phase encoding is effected through an additional application of a z gradient field.

19. NMR imaging method according to claim 1, wherein the magic sandwich exhibits a $\pi$ pulse at the position of half its time duration, and that remaining RF pulses of the magic sandwich are modified in order that no phase inversion takes place.

20. NMR imaging method according to claim 1, wherein a phase gradient is utilized only in one dimension and, for the other dimension, a read out of a magic echo signal transpires with a multi-pulse line narrowing pulse sequence under the influence of a read gradient.

21. NMR imaging method for the investigation of short transverse relaxation time substances, said method comprising the steps of:
- exposing the short transverse relaxation time substances to a homogeneous magnetic field;
- exposing the short transverse relaxation time substances to a sequence of RF pulses including an excitation pulse sequence and a magic sandwich pulse sequence; and
- at least in one time interval between the end of the excitation pulse sequence and the appearance of an echo signal applying at least temporarily at least one gradient field.

* * * * *